(12) United States Patent
Saint-Girons et al.

(10) Patent No.: US 8,389,995 B2
(45) Date of Patent: Mar. 5, 2013

(54) EPITAXIAL SOLID-STATE SEMICONDUCTING HETEROSTRUCTURES AND METHOD FOR MAKING SAME

(75) Inventors: Guillaume Saint-Girons, Lyons (FR); Ludovic Largeau, Bretigny sur Orge (FR); Gilles Patriarche, Saint Michel sur Orge (FR); Philippe Regreny, Chaselay (FR); Guy Hollinger, Moidieu-Detourbe (FR)

(73) Assignee: Centre National de la Recherche Scientifique (C.N.R.S.), Paris (FR)

( * ) Notice: Subject to any disclaimer, the term of this patent is extended or adjusted under 35 U.S.C. 154(b) by 199 days.

(21) Appl. No.: 12/678,548

(22) PCT Filed: Sep. 17, 2008

(86) PCT No.: PCT/FR2008/051669
§ 371 (c)(1),
(2), (4) Date: Jul. 7, 2010

(87) PCT Pub. No.: WO2009/047448
PCT Pub. Date: Apr. 16, 2009

(65) Prior Publication Data
US 2010/0289063 A1  Nov. 18, 2010

(30) Foreign Application Priority Data
Sep. 18, 2007 (FR) .................... 07 57652

(51) Int. Cl.
*H01L 29/10* (2006.01)
*H01L 29/76* (2006.01)
*H01L 31/036* (2006.01)
*H01L 31/112* (2006.01)
*H01L 29/00* (2006.01)
*H01L 21/00* (2006.01)
*H01L 21/84* (2006.01)
*H01L 21/336* (2006.01)
*H01L 21/425* (2006.01)

(52) U.S. Cl. .............. 257/67; 257/68; 257/69; 257/347; 257/348; 257/349; 257/350; 257/351; 257/352; 257/353; 257/354; 257/505; 257/507; 257/E21.193; 257/E29.286; 257/E29.292; 257/E31.042; 257/E31.046; 438/149; 438/152; 438/153; 438/154; 438/155; 438/156; 438/164; 438/292; 438/298; 438/309; 438/311; 438/412; 438/479; 438/517

(58) Field of Classification Search .............. 257/67–69, 257/505, 507, 347–354, E21.193, E29.286, 257/E29.292, E31.045, E31.046; 438/149, 438/152–156, 164, 282, 298, 309, 311, 412, 438/479, 517, 910
See application file for complete search history.

(56) References Cited

U.S. PATENT DOCUMENTS 6,410,941 B1 *  6/2002  Taylor et al. .................... 257/84
6,427,066 B1 *  7/2002  Grube ............................ 455/73

(Continued)

FOREIGN PATENT DOCUMENTS

JP  01181410 A  *  7/1989

OTHER PUBLICATIONS

International Search Report, dated Mar. 26, 2009, from corresponding PCT application.

*Primary Examiner* — Ida M Soward
(74) *Attorney, Agent, or Firm* — Young & Thompson

(57) ABSTRACT

A method for producing a solid-state semiconducting structure, includes steps in which:
(i) a monocrystalline substrate is provided;
(ii) a monocrystalline oxide layer is formed, by epitaxial growth, on the substrate;
(iii) a bonding layer is formed by steps in which:
(a) the impurities are removed from the surface of the monocrystalline oxide layer;
(b) a semiconducting bonding layer is deposited by slow epitaxial growth; and
(iv) a monocrystalline semiconducting layer is formed, by epitaxial growth, on the bonding layer so formed. The solid-state semiconducting heterostructures so obtained are also described.

20 Claims, 3 Drawing Sheets mâcle = twin

U.S. PATENT DOCUMENTS

| | | | | |
|---|---|---|---|---|
| 6,462,360 | B1* | 10/2002 | Higgins et al. | 257/189 |
| 6,472,276 | B1* | 10/2002 | Hilt et al. | 438/285 |
| 6,472,694 | B1* | 10/2002 | Wilson et al. | 257/189 |
| 6,608,327 | B1* | 8/2003 | Davis et al. | 257/76 |
| 6,841,274 | B2* | 1/2005 | Ueno et al. | 428/698 |
| 7,211,852 | B2* | 5/2007 | Ramdani et al. | 257/295 |
| 2002/0153524 | A1 | 10/2002 | Yu et al. | |
| 2002/0158265 | A1* | 10/2002 | Eisenbeiser | 257/98 |
| 2002/0163024 | A1* | 11/2002 | Jordan et al. | 257/295 |
| 2003/0015134 | A1* | 1/2003 | Tungare et al. | 117/86 |
| 2003/0024471 | A1 | 2/2003 | Talin et al. | |
| 2004/0011280 | A1 | 1/2004 | Higuchi et al. | |
| 2004/0139912 | A1* | 7/2004 | Tomasz Dwilinski et al. | 117/73 |
| 2007/0034892 | A1* | 2/2007 | Song | 257/103 |
| 2011/0204432 | A1* | 8/2011 | Chen et al. | 257/325 |

* cited by examiner mâcle = twin

EPITAXIAL SOLID-STATE SEMICONDUCTING HETEROSTRUCTURES AND METHOD FOR MAKING SAME

FIELD OF THE INVENTION

The present invention relates to epitaxial solid-state semiconducting heterostructures and to a method for producing them.

PRIOR ART

The integration of optoelectronic components into silicon-based systems is a key point in the development of the performances of such systems.

The most mature methods for integrating semiconductors on silicon, such as vignetting, smartcut or wafer bonding, are based on techniques of transfer by adhesive bonding. Such techniques involve complex technologies and are very expensive.

The production of solid-state semiconducting heterostructures by epitaxy would allow the technological complexity of the methods, and consequently the production costs, to be reduced considerably.

However, heteroepitaxy processes are at present limited by the difficulties arising from the parametric mismatch between the substrate and the material to be deposited by epitaxy. The first monolayers of a material with lattice mismatch on a substrate do not have defects, but beyond a certain thickness, called the critical thickness, a so-called plastic relaxation is observed. This transformation is accompanied by the formation of structural defects (dislocations, twins, stacking faults) which render the material unfit for use for the intended applications. For III-V or IV-IV materials, the critical thickness is typically of the order of several nanometres for a parametric mismatch of the order of one percent, and several monolayers for a mismatch of the order of several percent.

In order to reduce the number of defects, it has been proposed to use pseudosubstrates. Accordingly, the use of substrates of plastically relaxed germanium on Si has been proposed. Germanium is similar to GaAs in terms of lattice parameters.

This approach also has limits, however.

On the one hand, although the defects associated with the lattice parameter mismatch are reduced, those associated with the differences in crystalline structure remain. Accordingly, defects of the antiphase wall type are observed in the GaAs, caused by the difference in crystalline structure between Ge (diamond) and GaAs (zinc blend).

On the other hand, it is specific to GaAs and cannot be considered for other materials such as InP, which is a leading semiconductor for optoelectronic applications in the infrared range, the lattice parameter of which is very different from that of germanium.

In 2002, Motorola proposed an approach based on the use of buffer bilayers composed of an amorphous layer of $SiO_2$ surmounted by a layer of crystalline oxide. The underlying principle is based on dilatation of the amorphous layer, obtained by annealing, which leads to an increase in the lattice parameter of the crystalline oxide until a value close to that of GaAs is obtained.

The physical phenomena which occur in such a stack have not been elucidated with certainty. However, it is highly probable that the dilatation of the lattice parameter induced by annealing is accompanied by an undulation of the layers, which is highly detrimental to the crystalline quality of the GaAs taken up on the oxide.

In addition, this approach has not hitherto been practised on an industrial scale.

PROBLEM OF THE INVENTION

The object of the invention was, therefore, to propose a high-performance and inexpensive method which permits the solid-state production, by epitaxy, of semiconductor heterostructures on silicon while avoiding the problems discussed above.

In particular, a method was sought which allowed a structure to be obtained which did not have extended defects, whatever the parametric mismatch between the semiconductor and the substrate.

Another object of the invention was to propose structures so obtained, which do not have extended defects or metallic interfaces or amorphous silica resulting from adhesive bonding processes.

SUMMARY OF THE INVENTION

Surprisingly, it has been found that semiconducting solid-state heterostructures which are unstrained and do not have extended defects can be obtained on epitaxial oxide layers on Si when the monocrystalline oxide layer deposited on the substrate is subjected to a specific prior treatment.

From a fundamental point of view, it is assumed that this result is linked to the crystallographic and chemical heterogeneity between the epitaxial semiconductor on the crystalline oxide and the oxide itself. This heterogeneity makes it possible to avoid deformation of the semiconductor during the first stages of growth, which is at the origin of the formation of defects as described in the introduction, to the advantage of the deformation or rupture of interface bonds.

Consequently, the semiconductor grows on the crystalline oxide with its natural lattice parameter, it is not deformed and it is therefore not subjected to a process of plastic relaxation, which is at the origin of the formation of extended defects.

It is thus possible to obtain semiconducting crystalline heterostructures which do not have extended defects associated with plastic relaxation, on buffers of epitaxial crystalline oxides on Si.

It is to be noted, however, that the heterogeneity between the semiconductor and the oxide induces a high interface energy and can therefore cause three-dimensional initial growth, which manifests itself in the formation of islands.

By virtue of a specific method it is, however, possible (i) to obtain islands having specific characteristics in terms of orientation relative to the substrate and (ii) to obtain controlled coalescence of the islands in order to produce semiconducting heterostructures which can be used for the intended applications.

In its most general form, the treatment comprises two steps: the removal of impurities (especially carbonates) formed at the surface of the oxide, and the deposition of a fine semiconductor bonding layer under slow growth conditions and at a low temperature.

Preferably, the first step also comprises, if necessary, a step allowing the atomic configuration of the surface to be adapted by reconstruction. It is thus possible to obtain, in the subsequent step, the growth of semiconductor islands having the same crystallographic orientation relative to the substrate.

In the second step, it is preferred to promote the bonding of the semiconductor by adapting the growth conditions in order to optimize wetting so as to obtain islands that are as dense as possible.

Following this treatment, the purpose of the step of coalescence of the islands is to obtain a two-dimensional layer from the islands formed in the preceding step by the use of specific growth conditions. The growth of the heterostructure can then be continued under conventional conditions.

The semiconducting layer deposited on the bonding layer so obtained assumes its bulk lattice parameter as soon as growth starts, independently of its parametric mismatch with the substrate or the oxide. The heterostructure obtained is then devoid of any extended defect usually associated with conventional processes of plastic relaxation.

The absence of defects in the heterostructure is not dependent on the adaptation of the lattice parameter of the oxide under the effect of a dilated amorphous oxide layer, as proposed by the Motorola process. The semiconductor is therefore free of any elastic strain, which avoids the creation of defects associated with the relaxation of those strains, contrary to what is observed for all the systems of epitaxial materials with lattice mismatch.

The heterostructures obtained within the scope of the present invention are solid-state and wholly crystalline.

DESCRIPTION OF THE INVENTION

[Method]

According to a first aspect, therefore, the invention proposes a method for producing a solid-state semiconducting structure, which method comprises steps in which:
(i) a monocrystalline substrate is provided;
(ii) a monocrystalline oxide layer is formed, by epitaxial growth, on said substrate;
(iii) a bonding layer is formed by steps in which:
   (a) the impurities are removed from the surface of the monocrystalline oxide layer;
   (b) a semiconducting bonding layer is deposited by slow epitaxial growth; and
(iv) a monocrystalline semiconducting layer is formed, by epitaxial growth, on the bonding layer so formed.

The semiconducting structure is preferably wholly crystalline.

The oxide layer deposited in step (ii) is preferably obtained by direct growth, without phase change of the oxide.

Step (iii) is composed of a plurality of sub-steps.

In addition to steps (iii) (a) and (b) there can be provided, preferably during step (iii)(a), a step in which a reconstruction of the surface of the oxide is formed on an atomic scale in order to ensure a preferential crystallographic orientation of the semiconductor islands.

The creation of a preferential direction of orientation permits the growth of islands with a homogeneous crystallographic orientation and thus limits the creation of defects during coalescence.

Step (iii) (b) is preferably carried out in such a manner as to ensure a maximum semiconductor island density. This can be obtained, for example, by using a surfactant.

Step (iv) preferably comprises the prior coalescence of the islands formed in the preceding step.

The expression "extended defect" is intended to denote a defect in the crystalline structure which propagates through a thin layer, for example a dislocation, a twin or a domain wall (grain boundary), which may affect the electrical and optical properties of the stacks.

The expression "critical thickness" is intended to denote the thickness at which a strained epitaxial layer is capable of forming extended defects. That thickness depends on the nature of the epitaxial material and that of its substrate. By way of information, it is of the order of several nanometres for a parametric mismatch of the order of a tenth of a percent, and several monolayers for a mismatch of the order of one percent.

The term "semiconductor" is intended to denote any material having a valence band and a conduction band separated by a forbidden band which the electrons are able to cross only by virtue of external excitation. The term denotes IV-IV semiconductors, such as silicon and germanium, as well as III-V and II-VI semiconductors. It refers both to binary and to ternary or higher semiconductors. Accordingly, there may mentioned as III-V semiconductors GaAs, InP, InAs, GaP, GaSb, InSb, GaN, InN, AlN and their ternary or quaternary compounds, and as II-VI semiconductors CdSe, ZnSe, CdTe, ZnTe, ZnS, MgS, MgSe and their ternary or quaternary compounds. Among those compounds, InP, InAs and Ge are preferably used today.

"Surface reconstruction" is understood as being a long-range atomic arrangement of the surface obtained by annealing or physicochemical treatment, resulting in a symmetry rupture of the surface relative to the bulk material.

"Surfactant" is understood as being any chemical species which is supplied during growth and is not incorporated, or is incorporated only slightly, into the material, promoting two-dimensional rather than three-dimensional growth. Atoms having a large atomic radius, such as antimony, thallium, boron, are examples of such surfactants.

"Two-dimensional growth" is understood as being a layer-by-layer type of growth, also called Frank-van der Merwe growth. Two-dimensional growth is promoted when the binding energy between the deposited atoms is less than or equal to that between the thin layer and the substrate.

"Three-dimensional growth" is understood as being a type of growth by islands, also called Volmer-Weber growth. In three-dimensional growth, the growth of small seeds on the surface of the substrate is observed, which seeds form islands which subsequently coalesce to give a continuous thin layer. This mode of growth is generally promoted when the atoms forming the deposited layer are bound more strongly with one another than with the substrate.

The epitaxial crystalline oxide layer on the substrate acts as a compliant buffer by accommodating the difference between the lattice parameters of the substrate and of the semiconductor.

The parametric mismatch between the epitaxial semiconductor and the substrate actually has no effect on the density of the extended defects. The results obtained show that the mismatch is immediately and wholly relaxed as soon as the first epitaxial semiconductor monolayer forms.

This result is in principle not dependent on the nature of the substrate, of the oxide or of the semiconductor. It is, however, based on different mechanisms according to the symmetry configurations.

Accordingly, the parametric mismatch between the semiconductor and the oxide can be accommodated either by providing a network of interfacial dislocations which do not propagate into the layer (case 1), or by the absence of generation of defects associated with the lattice mismatch (case 2).

Case (1) is observed when the crystallographic orientation of the semiconductor is the same as that of the oxide. The confinement of the dislocations is then associated with the crystallographic properties of the oxide/semiconductor interface. It is due to the fact that the sliding planes of the dislocations are not the same in the oxide and in the semiconductor. The lattice mismatch dislocations generated at the interface are then unable to propagate into the semiconductor and therefore remain confined to the interface.

Case (2) is observed when the crystallographic orientation of the semiconductor is different from that of the oxide. In this case, it is possible, by adapting the growth conditions, to obtain complete relaxation of the semiconductor by displacement of the oxygen atoms from the surface of the oxide and by generation of a certain number of pendant bonds at the interface.

The substrate provided in step (i) is in most cases monocrystalline silicon. Advantageously, the substrate is monocrystalline silicon with orientation (100), (110), (111) or (001).

Apart from their ability to be deposited by epitaxy, there is no specific limitation regarding the oxides used to form the monocrystalline oxide layer in step (ii).

However, the oxide is preferably chosen so that the crystallographic and chemical heterogeneity with the semiconductor is sufficient. That heterogeneity is characterized by three parameters: the difference in crystalline structure between the semiconductor and the buffer (the phenomenon of compliance is promoted if the structures are very different), the difference in lattice parameter between the two materials (the phenomenon of compliance is promoted if the parametric mismatch is large, typically greater than 3 percent), and the chemical affinity between the materials (the phenomenon of compliance is promoted if it is low). The combination of these three parameters is not a priori indispensable, and one or two of the parameters can be sufficient to observe the phenomenon described here. The majority of crystalline oxides satisfy these conditions.

The nature of the crystalline oxide layer is ultimately of little importance, given that its main function is to provide an oxygen-rich crystalline surface layer.

The oxides can especially be oxides of the perovskite family ($(Ba,Sr)TiO_3$, $LaAlO_3$, etc.), of the lanthanide family ($La_2O_3$, $Pr_2O_3$, $Gd_2O_3$, $Nd_2O_3$, $Y_2O_3$, etc.), zirconates ($ZrO_2$, $SrZrO_3$, etc.), simple cubics (BaO, SrO, $CeO_2$) or spinels ($Al_2O_3$). Among these, particular mention may be made of $Gd_2O_3$, $Al_2O_3$ and $(Ba,Sr)TiO_3$. The oxide formed in step (ii) is preferably chosen from $SrTiO_3$, $Al_2O_3$ and $Gd_2O_3$.

The oxide can be chosen as a function of its crystalline quality when it is deposited by epitaxy on the substrate. From this point of view, and with regard to silicon, very good results are obtained with buffer layers of $Gd_2O_3/Si(111)$ and $SrTiO_3/Si(001)$.

Step (iii) is particularly important within the context of the method according to the invention.

This step itself comprises two steps.

The purpose of the first step is to prepare the surface of the epitaxial crystalline oxide layer on the substrate. In the first instance, an oxide surface that is clean and uncontaminated is to be obtained. This step is known per se, for example from document (D. Abriou et al., Surf. Sci. 352-354, (1996), 499).

Preferably, this treatment also permits the creation of a preferential growth orientation direction on the surface.

Advantageously, step (iii) (a) is carried out by treatment with an oxidizing compound selected from oxygen, ozone and atomic oxygen.

The epitaxial oxide layer on the substrate can then be annealed under an oxidizing atmosphere, for example under molecular oxygen. By way of information, annealing can be conducted in the case of $SrTiO_3/Si(001)$ and of $Gd_2O_3/Si(111)$ under an oxygen pressure of from $10^{-6}$ to $10^{-3}$ torr, preferably $10^{-6}$ torr, and at a temperature of from 200 to 600° C., especially 400° C. In the case of $SrTiO_3/Si(001)$, annealing under an ultrahigh vacuum (residual pressure from $10^{-11}$ to $10^{-8}$ torr, preferably $10^{-9}$ torr) for from 30 to 60 minutes, preferably 45 minutes, at from 400 to 700° C., preferably 600° C., is also suitable.

The purpose of step (iii) (b) is to obtain a crystallographic structure of the surface of the buffer which permits the growth of islands which are all oriented in the same manner relative to the substrate. This is useful in particular in the case of (001)-oriented III-V or IV-IV semiconductors, for which the main surface crystallographic directions oriented at 90° relative to one another are not equivalent. This is carried out by obtaining a surface reconstruction suitable for orienting all the islands in the same manner.

It is possible to obtain such a reconstruction directly during growth of the oxide. The reconstruction can also be obtained a posteriori, for example by means of annealing in vacuo or under oxygen, by hydrogen treatment or optionally by plasma treatment. In the case of the system $Gd_2O_3/Si(111)$, reconstruction is not essential because InP grows with orientation (111). In the case of $SrTiO_3/Si(001)$, on the other hand, such a step is preferable. Annealing under an ultrahigh vacuum or under oxygen at 700° C. for one hour allows a surface reconstruction that satisfies the conditions described above to be formed.

The purpose of step (iii) (b) is to form a semiconductor bonding layer. Owing to the high interface energy, growth in step (iii)(b) is in most cases three-dimensional, which manifests itself in the formation of islands. It is preferable to proceed so that islands that are as dense as possible are obtained, that is to say wetting is promoted.

The required growth conditions depend on the semiconductor/oxide pairs in question. In general, a compromise has to be found between effective bonding of the semiconductor and the associated oxide, with pronounced wetting, and conditions which ensure a good crystalline quality of the islands.

This compromise can be obtained by choosing slow growth, which favours good crystallinity, and a low growth temperature, which favours good wetting.

By way of example of such conditions, there may be mentioned for the pair $InP/Gd_2O_3/Si(111)$ a deposit of 5 nm (from 1 to 10 nm) of InP at 400° C. (from 350 to 425° C.) and at a rate of 0.2 monolayer/s (from 0.05 to 1 monolayer/s), under a phosphorus pressure of $4.10^{-6}$ torr (from 2 to $6.10^{-6}$ torr).

For the pair $InP/SiTiO_3/Si(001)$, a deposit of 5 nm (from 1 to 10 nm) of InP at 430° C. (from 430 to 480° C.) and at a rate of 0.2 monolayer/s (from 0.05 to 1 monolayer/s), under a phosphorus pressure of $4.10^{-6}$ torr (from 2 to $6.10^{-6}$ torr) may be appropriate.

These conditions permit the formation of islands having a typical density of from $10^{10}$ to $10^{11}$ $cm^{-2}$.

According to a preferred embodiment, surfactants that promote bonding of the semiconductor, and therefore wetting, can be used. Such surfactants can be chosen especially from antimony, boron, thallium or any III or V element having a large atomic volume which does not become incorporated into the lattice of the semiconductor.

The purpose of step (iv) is to obtain growth of the semiconductor bonding layer formed by coalescence of the islands formed in step (iii)(b).

The required growth conditions are evidently dependent on the semiconductor/oxide pairs in question. In general, surface diffusion is to be promoted in order to obtain effective coalescence, while coming close to the natural growth conditions of the semiconductor in question. For the systems mentioned above, the following growth conditions have been found to be appropriate:

For the pair InP/Gd$_2$O$_3$/Si(111), a deposit of InP at 500° C. (from 450 to 520° C.) and at a rate of 0.2 monolayer/s (from 0.05 to 2 monolayer/s), under a phosphorus pressure of $10^{-6}$ torr (from $5.10^{-7}$ to $2.10^{-6}$ torr).

For the pair InP/SrTiO$_3$/Si(001), a deposit of InP at 480° C. (from 430 to 500° C.) and at a rate of 1 monolayer/s (from 0.05 to 2 monolayer/s), under a phosphorus pressure of $10^{-5}$ torr (from $5.10^{-6}$ to $5.10^{-5}$ torr).

The crystalline semiconducting layer so produced constitutes an optimal support for the continued growth, which can be carried out under the standard homoepitaxy conditions for the semiconductor in question. Monodomain and monocrystalline growth of the semiconductor is observed on the bonding layer so prepared.

Advantageously, the semiconducting layer deposited in steps (iii) and (iv) is composed substantially of a III-V compound or of Ge. Preferably, the semiconducting layer formed in steps (iii) and (iv) is composed substantially of a binary or ternary III-V compound. Advantageously, the semiconducting layer formed in step (iv) is composed substantially of a III-V compound selected from the group consisting of GaAs, InP and InAs. Preferably, the semiconducting layer formed in steps (iii) and (iv) is composed substantially of InP.

The described method permits the production of two-dimensional layers but also of other objects such as, especially, unstrained semiconducting quantum dots of excellent crystalline quality, without a wetting layer.

[Structures]

The described method can be carried out in conventional molecular beam epitaxy (MBE) equipment. Advantageously, the production of the semiconducting structure is carried out wholly by molecular beam epitaxy.

The use of other epitaxy techniques, such as organometallic vapour phase epitaxy, which is better suited to industrial constraints, can also be considered.

There are accordingly provided wholly epitaxial heterostructures which do not have traversing defects, are inexpensive and have very valuable optical and electrical properties.

In particular, the method is also suitable for the production of more complex structures, for example comprising heterogeneous stacks of semiconducting layers or nanocrystallites (quantum dots).

According to a second aspect, the invention therefore relates to a wholly crystalline solid-state semiconducting heterostructure comprising:
  a monocrystalline substrate;
  a monocrystalline oxide layer deposited directly on said substrate; and
  a monocrystalline semiconducting layer deposited on the oxide layer.

Preferably, the monocrystalline semiconducting layer has a dislocation density below $10^5$ cm$^{-2}$. Unlike the structures obtained by adhesive bonding, there is neither a metallic layer nor amorphous silicon at the interface between the semiconductor and the substrate.

It is also possible in step (iii) of the method to form semiconductor nanocrystallites on the surface of the oxide. To that end, it is necessary to choose a growth temperature which is higher than the temperature allowing an optimal bonding layer to be obtained, as well as a lower element V pressure in the case of III-V semiconductors, in order to promote the surface migration of the atoms. The nanocrystallite density can be adjusted as desired between several $10^7$ cm$^{-2}$ and $10^{11}$ cm$^{-2}$ by adapting those two parameters. The size of the nanocrystallites can be adjusted by way of the number of semiconductor monolayers deposited. The nanocrystallites grow with the lattice parameter of the bulk material and do not have extended defects.

In the case of InP, the conditions for obtaining nanocrystallites can be a temperature of from 450° C. to 550° C., a phosphorus pressure of from 1 to $6.10^{-6}$ torr and a bonding layer having a thickness of from 1 to 5 monolayers.

Particular mention is to be made of the semiconducting heterostructures in which the semiconducting layer formed in step (iv) is composed of InP.

[Applications]

As already indicated, the parametric mismatch between the semiconductor and the oxide has virtually no effect on the density of extended defects associated with plastic relaxation in the semiconducting layer. It is therefore not limited by the parametric mismatch between the semiconductor and the oxide. The described method can therefore be applied for the growth of any semiconductor of interest.

It also permits the integration, on a monocrystalline oxide layer on a substrate, of semiconducting quantum dots which are unstrained, that is to say have their bulk lattice parameter, and allows their shape, their size and their density to be controlled without any limitation associated with the strain between the semiconductor and the oxide or the substrate.

The method can therefore be employed to produce heterostructures for very varied applications in microelectronics and optoelectronics, as well as to produce complex devices such as displays and LEDs.

BRIEF DESCRIPTION OF THE DRAWING FIGURES

The invention will be explained in greater detail in the examples which follow, and by means of the figures, in which.

DETAILED DESCRIPTION OF THE INVENTION

EXAMPLES

Example 1

Preparation of a Semiconducting Heterostructure (InAsP, InP)/Gd$_2$O$_3$/Si111

An Si(111) substrate (obtainable from ACM, France) is subjected to cleaning comprising immersion for 10 seconds in a bath of pure NI$_4$F followed by rinsing with deionized water and drying, before it is immediately introduced into a modified RIBER 2300 chamber for the growth of oxides by molecular beam epitaxy.

A thickness of 4 nm of Gd$_2$O$_3$ is deposited on the substrate by evaporating a Gd$_2$O$_3$ target by means of an electron gun at a temperature of 700° C., a partial oxygen pressure of $10^{-6}$ torr being adjusted. A strained monocrystalline $Gd_2O_3$ layer of excellent quality is obtained.

The substrate so coated is then removed from the RIBER 2300 chamber and introduced into a connected system, under an ultrahigh vacuum, comprising a chamber for cleaning under $O_2$ and a molecular beam epitaxy device (RIBER 32 chamber). Treatment under molecular oxygen (pressure $10^{-5}$ torr) is carried out in the cleaning chamber at 400° C.

The substrate is then transferred, under an ultrahigh vacuum, to the container of the molecular beam epitaxy device (RIBER 32 chamber). It is first heated with a temperature gradient of from 30 to 400° C. under a partial phosphorus pressure of $10^{-5}$ torr. At the same temperature, 7 nm of InP are deposited by epitaxy under a phosphorus pressure of $10^{-5}$ torr at a growth rate of 0.21 µm/h.

Epitaxial growth of the InP at a temperature of about 450° C. is then carried out, at a rate of 1 µm/h and a phosphorus pressure of $4.10^{-6}$ torr. Under these conditions there are deposited 750 nm of InP, a quantum well of InAsP (thickness of 6 nm) and then a layer of InP having a thickness of 20 nm.

The semiconducting layers so obtained are monodomain, monocrystalline and wholly relaxed from the start of the growth, and they do not contain extended defects associated with a process of plastic relaxation.

The structural and optical properties of the prepared sample were studied as described below.

Reflection High-Energy Electron Diffraction (RHEED)

Figure 1:
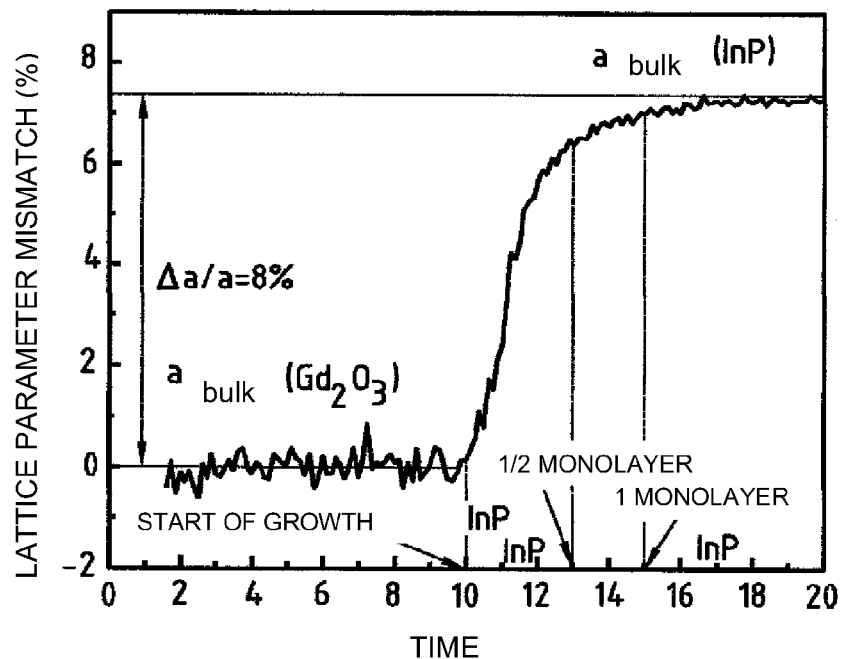
FIG. 1 shows the change in the lattice parameter mismatch of epitaxial InP on Gd$_2$O$_3$/Si(111) obtained according to Example 1, measured by RHEED.

The change in the lattice parameter of the epitaxial InP according to Example 1 was measured in situ during the growth. It is recorded in FIG. 1. It is noted that InP regains its bulk lattice parameter as soon as the first monolayer is deposited.

This makes it possible to avoid the formation of extended dislocations, which is normally observed in all the strained systems studied hitherto. It is associated with the formation of an interfacial network of dislocations which do not propagate into the InP layer, as is shown in the TEM image (see FIG. 2).

Transmission Electron Microscopy (TEM)

Figure 2:
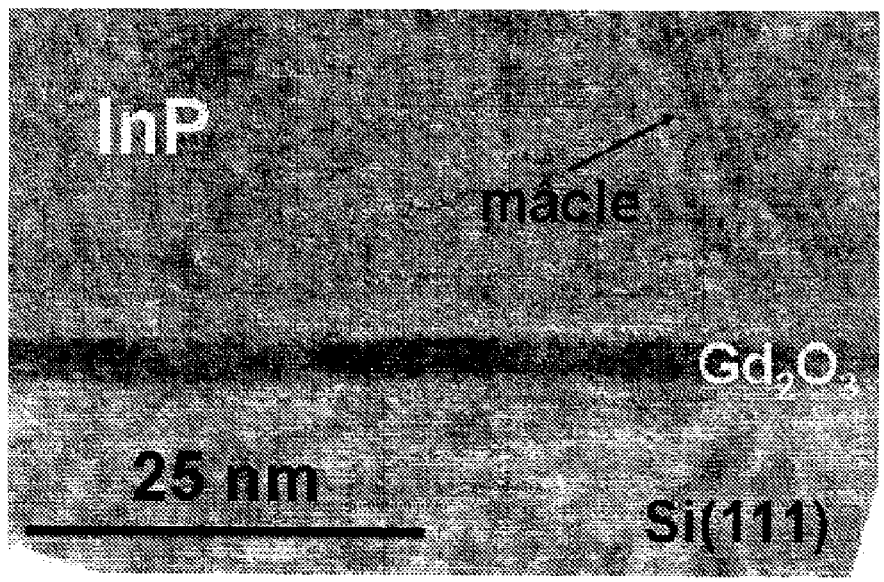
FIG. 2 shows a TEM image in transverse section of a sample of epitaxial InP on Gd$_2$O$_3$/Si(111) obtained according to Example 1.

A sample obtained according to Example 1 was analyzed by TEM (see FIG. 2). It is noted that the stack InP/$Gd_2O_3$/Si (111) has very good crystalline quality. It constitutes a monodomain monocrystal with a wholly relaxed abrupt interface.

The InP includes several twins, which are visible in FIG. 2. However, it appears that their presence is not intrinsic to the method but is rather the result of the residual roughness of the surface of the $Gd_2O_3$. The InP does not contain traversing dislocations.

Photoluminescence (PL)

The photoluminescence spectrum of the quantum well of InAsP/InP produced on $Gd_2O_3$/Si(111) according to Example 1 was measured using equipment comprising a GaAs/AlGaAs pump diode emitting at 730 nm, a focusing lens for the pump and for collecting the PL, a grating monochromator and a Peltier-cooled InGaAs detector.

Figure 3:
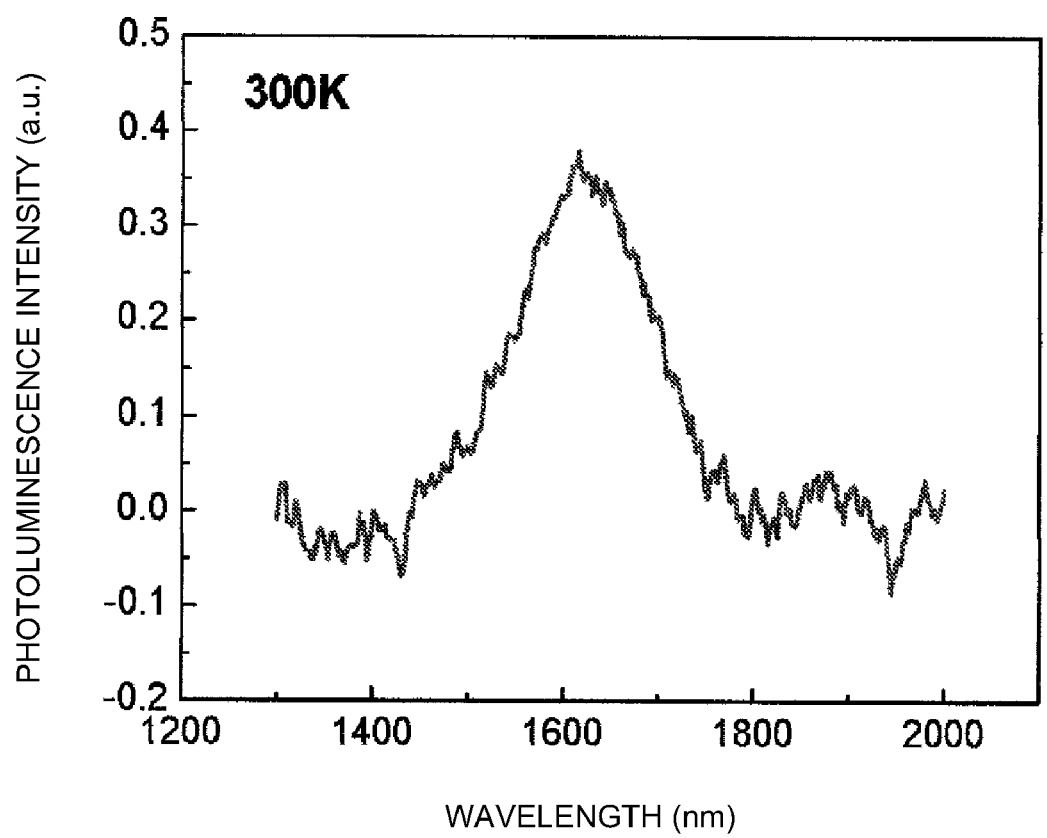
FIG. 3 shows a photoluminescence spectrum at 300K of a sample of epitaxial InP on Gd$_2$O$_3$/Si(111) obtained according to Example 1.

The photoluminescence spectrum at 300 K of the quantum well structure of InAsP inserted in a matrix of InP/$Gd_2O_3$/Si (111) obtained according to Example 1 is shown in FIG. 3.

The peak corresponding to the quantum well is shown clearly and with good resolution on the spectrum. At ambient temperature, the spectrum has an acceptable full width at half maximum (80 meV) and intensity and is evidence of the good structural quality of the stack, compatible with the production of optical components integrated in solid-state manner on the substrate.

Example 2

Preparation of a semiconducting heterostructure InP/$SrTiO_3$/Si(001)

A layer of $SrTiO_3$ is deposited by molecular beam epitaxy in a RIBER 2300 chamber on an Si(001) substrate supplied by STMicroelectronics and previously cleaned as in Example 1.

The surface of the Si is first treated by forming a monolayer of SrO. To that end, the temperature of the substrate is brought to 550° C. and its surface is exposed to a strontium pressure of $5.10^{-8}$ torr for 3 minutes. The substrate is then brought to 750° C., which causes the stabilization of ⅓ of a monolayer of Sr at the surface of the silicon. The temperature of the substrate is then brought to 550° C. again, and the substrate is exposed to the same flow of strontium until ½ monolayer is obtained. Finally, the temperature of the substrate is brought to the growth temperature of $SrTiO_3$ (from 350 to 400° C.), and the surface is exposed to a partial oxygen pressure of $5.10^{-8}$ torr in order to oxidize the ½ monolayer of strontium and obtain a monolayer of SrO.

A layer of $SrTiO_3$ is then deposited by coevaporation of Sr and Ti under an oxygen pressure of $10^{-7}$ torr. Precise calibration of the stoichiometry of the oxide with the aid of a quartz microbalance, as well as good control of the growth temperature of the oxide (from 350 to 400° C.), make it possible to obtain a monocrystalline oxide layer which does not have extended defects or an amorphous interfacial layer between the oxide and the Si.

The sample is then removed from the RIBER 2300 and introduced into the connected system, in vacuo, comprising the chamber for treatment under molecular oxygen and the RIBER 32 growth chamber. The surface of the sample is treated under oxygen as described in Example 1. The sample is then transferred, under an ultrahigh vacuum, to the epitaxy chamber and heated under an ultrahigh vacuum ($10^{-10}$ torr) to 500° C. and then exposed to a phosphorus pressure of $4.10^{-6}$ torr for 10 s. Three monolayers of InP are then deposited at that temperature and at that phosphorus pressure, at a rate of 0.21 µm/h.

There are thus obtained quantum dots of InP/$SrTiO_3$/Si (001) of excellent crystalline quality, which are wholly relaxed and do not have either a wetting layer or defects.

The structural properties of the sample were analyzed by atomic force microscopy (AFM) and by TEM.

AFM

Figure 4:
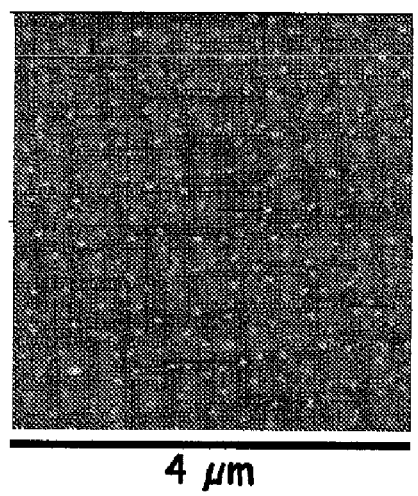
FIG. 4 shows an AFM image of a sample of epitaxial InP on SrTiO$_3$/Si(001) obtained according to Example 2.

A sample obtained according to Example 2 was analyzed by AFM (see FIG. 4). It is noted that quantum dots of InP were formed, that their density is of the order of $5.10^{-9}$ cm$^{-2}$ and that their lateral size is about twenty nanometres.

TEM

Figure 5:
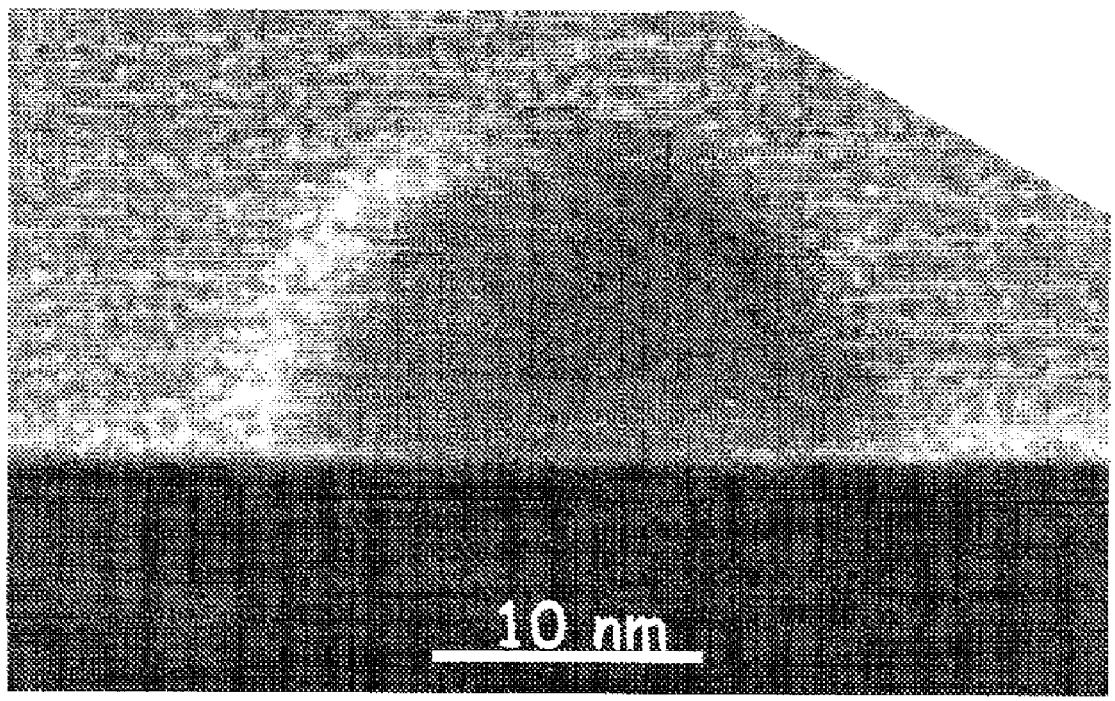
FIG. 5 shows a TEM image in transverse section of a quantum dot of the sample of epitaxial InP on SrTiO$_3$/Si(001) obtained according to Example 2.

A view in section of one of the quantum dots of the sample obtained according to Example 2 under a transmission electron microscope is shown in FIG. 5. It is noted in particular that there is no wetting layer and that the quantum dot is a perfect crystal of InP on $SrTiO_3$/Si(001).

The structural properties of the quantum dots are compatible with applications in optoelectronics. In particular, they do not contain any extended defect which may impair their optical or electronic properties.

The invention claimed is:

1. A method for producing a wholly crystalline solid-state semiconducting structure, comprising:
   (i) providing a monocrystalline substrate;
   (ii) forming a monocrystalline oxide layer, by epitaxial growth, on said substrate;
   (iii) forming a bonding layer by steps in which:

(a) removing impurities from a surface of the monocrystalline oxide layer;
(b) depositing a semiconducting bonding layer by slow epitaxial growth; and
(iv) forming a monocrystalline semiconducting layer, by epitaxial growth, on the bonding layer.

2. The method according to claim 1, further comprising a step of reconstructing the surface on an atomic scale.

3. The method according to claim 2, in which the step of reconstructing the surface is carried out during step (iii)(a).

4. The method according to claim 1, in which step (iii)(a) is carried out by treating with an oxidizing compound selected from the group consisting of oxygen, ozone and atomic oxygen.

5. The method according to claim 1, in which, in step (iii)(b), the bonding layer is formed by epitaxy of the semiconductor at a rate of from 0.1 to 0.5 monolayer/s.

6. The method according to claim 1, in which, in step (iii)(b), the bonding layer is formed by epitaxy of the semiconductor at a substrate temperature of from 250 to 500° C., depending on the semiconductor in question, under conditions which are not favorable to surface migration.

7. The method according to claim 1, in which the substrate is silicon with an orientation of (100), (110), (111) or (001).

8. The method according to claim 1, in which the oxide formed in step (ii) is $SrTiO_3$ or $Gd_2O_3$.

9. The method according to claim 1, in which the semiconducting layer formed in step (iv) is composed substantially of a III-V compound or of Ge.

10. The method according to claim 1, in which the semiconducting layer formed in step (iv) is composed substantially of a binary or ternary III-V compound.

11. The method according to claim 1, in which the semiconducting layer formed in step (iv) is composed substantially of a III-V compound selected from the group consisting of GaAs, InP and InAs.

12. The method according to claim 1, in which the semiconducting layer formed in step (iv) is composed substantially of InP.

13. A solid-state wholly crystalline semiconducting heterostructure comprising:
a monocrystalline substrate;
a monocrystalline oxide layer deposited directly on said substrate; and
a monocrystalline semiconducting layer deposited on the oxide layer,
in which the monocrystalline semiconducting layer has a dislocation density below $10^5$ $cm^{-2}$.

14. The semiconducting heterostructure according to claim 13, further comprising nanocrystallites.

15. The semiconducting heterostructure according to claim 13, in which the monocrystalline semiconducting layer is composed of InP.

16. The method according to claim 1, wherein the monocrystalline oxide layer is formed from $(Ba,Sr)TiO_3$, $LaAlO_3$, $La_2O_3$, $Pr_2O_3$, $Gd_2O_3$, $Nd_2O_3$, $Y_2O_3$, BaO, SrO, $CeO_2$ or $Al_2O_3$.

17. The semiconducting heterostructure according to claim 13, wherein the monocrystalline oxide layer is formed from $(Ba,Sr)TiO_3$, $LaAlO_3$, $La_2O_3$, $Pr_2O_3$, $Gd_2O_3$, $Nd_2O_3$, $Y_2O_3$, BaO, SrO, $CeO_2$ or $Al_2O_3$.

18. A solid-state wholly crystalline semiconducting heterostructure comprising:
a monocrystalline Si substrate with an orientation of (100), (110), (111) or (001);
a monocrystalline oxide layer deposited directly on said substrate, the monocrystalline oxide layer being formed from $(Ba,Sr)TiO_3$, $LaAlO_3$, $La_2O_3$, $Pr_2O_3$, $Gd_2O_3$, $Nd_2O_3$, $Y_2O_3$, BaO, SrO, $CeO_2$ or $Al_2O_3$; and
a monocrystalline semiconducting layer deposited on the oxide layer,
in which the monocrystalline semiconducting layer has a dislocation density below $10^5$ $cm^{-2}$.

19. The semiconducting heterostructure according to claim 18, wherein the Si substrate and monocrystalline oxide layer are $Gd_2O_3/Si(111)$.

20. The semiconducting heterostructure according to claim 18, wherein the Si substrate and monocrystalline oxide layer are $SrTiO_3/Si(001)$.

* * * * *

UNITED STATES PATENT AND TRADEMARK OFFICE
CERTIFICATE OF CORRECTION

PATENT NO. : 8,389,995 B2
APPLICATION NO. : 12/678548
DATED : March 5, 2013
INVENTOR(S) : Saint-Girons et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 311 days.

Signed and Sealed this
First Day of September, 2015

Michelle K. Lee
*Director of the United States Patent and Trademark Office*